(12) United States Patent
Kishi

(10) Patent No.: US 7,047,264 B2
(45) Date of Patent: May 16, 2006

(54) FREQUENCY CONVERTER

(75) Inventor: Takahiko Kishi, Yokohama (JP)

(73) Assignee: Samsung Electronics Co., Ltd., (KR)

( * ) Notice: Subject to any disclaimer, the term of this patent is extended or adjusted under 35 U.S.C. 154(b) by 545 days.

(21) Appl. No.: 10/090,521

(22) Filed: Mar. 4, 2002

(65) Prior Publication Data

US 2002/0156820 A1  Oct. 24, 2002

(30) Foreign Application Priority Data

Mar. 2, 2001 (JP) .......................... 2001-058396

(51) Int. Cl.
*G06F 17/10* (2006.01)
(52) U.S. Cl. ..................... 708/313; 375/350
(58) Field of Classification Search ............... 708/313; 375/350
See application file for complete search history.

(56) References Cited

U.S. PATENT DOCUMENTS

| | | | |
|---|---|---|---|
| 5,592,517 A * | 1/1997 | Camp et al. ............ | 375/350 |
| 5,757,867 A * | 5/1998 | Caulfield et al. ......... | 375/350 |
| 6,134,569 A * | 10/2000 | Kot ........................ | 708/3 |
| 6,356,569 B1* | 3/2002 | Sonalkar et al. .......... | 370/545 |
| 6,452,982 B1* | 9/2002 | O'Dell et al. ............ | 375/316 |
| 6,590,510 B1* | 7/2003 | Woog ...................... | 341/61 |
| 6,834,292 B1* | 12/2004 | Jiang et al. ............... | 708/313 |
| 2001/0037351 A1* | 11/2001 | Hellberg .................. | 708/313 |
| 2004/0240596 A1* | 12/2004 | Liu ......................... | 375/350 |

* cited by examiner

Primary Examiner—D. H. Malzahn
(74) Attorney, Agent, or Firm—Dilworth & Barrese LLP

(57) ABSTRACT

Disclosed is a frequency converter with an excellent frequency characteristic, having a minimized number of multipliers. A digital down-converter includes a decimator/mixer, an interpolator and a channel filter. The decimator/mixer performs quadrature conversion from a real signal to complex signals, frequency conversion by a frequency $K\omega$, and $1/(M\times I)$-fold decimation on a signal obtained by sampling an RF/IF signal S(i) by an A/D converter. The interpolator is comprised of I-fold up-samplers and lowpass filters, and performs I-fold interpolation on the outputs from the decimator/mixer. The channel filter is comprised of lowpass filters having a band characteristic given to a communication channel, and outputs band-rejected baseband signals i(j) and q(j) by filtering the outputs of the interpolator.

6 Claims, 13 Drawing Sheets

FREQUENCY CONVERTER

PRIORITY

This application claims priority to an application entitled "Frequency Converter" filed in the Japanese Patent Office on Mar. 2, 2001 and assigned Serial No. 2001-58396, the contents of which are hereby incorporated by reference.

BACKGROUND OF THE INVENTION

1. Field of the Invention

The present invention relates generally to a frequency converter for converting a frequency of an input signal by digital signal processing, and in particular, to a frequency converter with an excellent frequency characteristic, capable of converting a sampling frequency.

2. Description of the Related Art

A conventional frequency converter includes a digital down-converter (DDC) and a digital up-converter (DUC). The digital down-converter A/D (Analog-to-Digital)-converts a received RF/IF (Radio Frequency/Intermediate Frequency) signal, and then down-converts the A/D-converted signal to a baseband or demodulation IF signal by digital signal processing. The digital up-converter D/A (Digital-to-Analog)-converts a baseband or modulation IF signal, and then up-converts the D/A-converted signal by digital signal processing in order to generate a transmission RF/IF signal. These frequency converts perform frequency conversion not only on an intact signal but also on a sampling frequency of the signal according to a difference between a sampling frequency needed for RF/IF signal processing and a sampling frequency needed for baseband/modulation/demodulation IF signal processing.

Typically, a multiplier is used as a mixer for frequency conversion of an intact signal, and a decimation filter and an interpolation filter are generally used for suppression of aliasing that occurs while converting a sampling frequency. A general multiplier-based filter requires a plurality of multipliers, causing an increase in circuit size and power consumption. Thus, when a ratio of the sampling frequency to the signal frequency is high, a CIC (Cascade Integrated Comb) filter made by cascading a comb filter and an integrator is generally used.

FIG. 1 illustrates a conventional digital down-converter (DDC) constructed with a CIC filter. Referring to FIG. 1, a digital down-converter 51 includes a quadrature converter (or orthogonal converter) 53, a 1/N-fold decimator 54, a 1/D-fold decimator 55, and a channel filter 56. The quadrature converter 53 is comprised of multipliers 41 for multiplying a sampling signal, obtained by A/D-converting an RF/IF signal S(i) by an A/D converter 52, by signals cos(i) and −sin(i), respectively. The 1/N-fold decimator 54 is comprised of CIC filters 42, and the 1/D-fold decimator 55 is comprised of lowpass filters (FIR (Finite Impulse Response) filters) 43 and 1/D-fold down-samplers 44. The channel filer 56 is comprised of lowpass filters 45. The digital down-converter 51 down-converts the RF/IF signal S(i) to a baseband frequency through the quadrature converter 53, and then down-samples the sampling frequency through the 1/N-fold decimator 54 and the 1/D-fold decimator 55.

FIG. 2 illustrates a detailed structure of the CIC filter for down sampling, illustrated in FIG. 1. The CIC filter includes adders 61, delays 62, subtracters 63, delays 64, and a 1/N-fold down-sampler 65. The adders 61 and the delays 62 constitute a lowpass filter of a section M, while the subtracters 63 and the delays 64 constitute a comb filter of the section M. An input/output signal frequency characteristic of the CIC filter is defined as "$H(Z)=(1-Z^{-MN})/(1-Z^{-1})$", $H(Z)$ is system function. As represented by a characteristic curve A in FIG. 3, a filter characteristic of a pass band is not smooth. A characteristic curve B is a graph given by expanding a frequency axis of the characteristic curve A.

The CIC filter-based digital down-converter can suppress aliasing without using multipliers, but the pass band characteristic of the filter is not smooth. Therefore, when a frequency bandwidth of an input signal is widened, it is necessary to correct frequency characteristic distortion of the signal, caused by the CIC filter. However, an expansion of the pass band deteriorates a rejection band characteristic of the filter, making it impossible to suppress the aliasing as intended.

SUMMARY OF THE INVENTION

Therefore, the present invention has been made in view of the above problems, and it is an object of the present invention to provide a frequency converter with an excellent frequency characteristic, having a reduced number of multipliers.

In accordance with one aspect of the present invention, there is provided a frequency converter for converting a frequency of an input signal to an arbitrary frequency. The frequency converter comprises a polyphase structure filter for multiplying M polyphase filters each having N=L/M coefficients (where L and M are both a positive integer) determined by dividing L coefficients by M, by M signals determined by sampling signals for a period K of a sine wave having a period M/K for one sampling period, on a one-to-one basis; and a sampling frequency converter with a conversion ratio M. For example, the polyphase structure filter in FIG. 6 is comprised of multipliers 11, adders 12, delays 13, and multiplexers 14. Alternatively, the polyphase structure filter is comprised of multipliers 24, delays 25, multipliers 26, adders 27 and an adder 28. Further, the sampling frequency converter is comprised of latch circuits 15, hold circuits or hold circuits 31.

By sharing multipliers used for frequency conversion and a filter based on the polyphase structure, it is possible to realize a frequency converter having a reduced number of multipliers and also having a filter function, a frequency conversion function, and a sampling frequency conversion function.

The frequency converter comprises a polyphase structure filter or a sampling frequency converter with a conversion ratio M1, for multiplying M1 polyphase filters by M1 signals determined by sampling signals for a period K of a sine wave having a period M1/K for one sampling period, on a one-to-one basis. For example, the polyphase structure filter or the sampling frequency converter with a conversion ratio M1 includes an interpolator 5 in FIG. 8 in a second embodiment. Alternatively, the polyphase structure filter comprises a polyphase structure filter or sampling frequency converter with a conversation ratio M2, for multiplying M2=M−M1 polyphase filters by M2 signals determined by sampling signals for a period K of a sine wave having a period M2/K for one sampling period, on a one-to-one basis. For example, the polyphase structure filter or the sampling frequency converter with a conversion ratio M2 includes an interpolator/mixer 6 in the second embodiment.

The frequency converter further comprises an I-fold interpolator (where I is a positive integer) arranged in a stage following the polyphase structure filter. For example, the I-fold interpolator in FIG. 9 is comprised in an interpolator 3 of a first embodiment. The polyphase structure filter (e.g., a decimator/mixer 2 in the first embodiment) multiplies (M×I) polyphase filters each having P=L/(M×I) coefficients determined by dividing L coefficients by (M×I), by (M×I) signals determined by sampling signals for a period K of a sine wave having a period (M×I)/K for one sampling period, on a one-to-one basis. The sampling frequency converter performs 1/(M×I)-fold interpolation.

In this manner, the frequency converter can be realized as being capable of performing multi-rate conversion and subdividing its frequency step by I.

The frequency converter further comprises a 1/D-fold decimator (where D is a positive integer) arranged in a stage preceding the polyphase structure filter. For example, the 1/D-fold decimator in FIG. 12 is comprised of a decimator 8 in a third embodiment. The polyphase structure filter (e.g., an interpolator/mixer 9) multiplies (M×D) polyphase filters each having Q=L/(M×D) coefficients determined by dividing L coefficients by (M×D), by (M×D) signals determined by sampling signals for a period K of a sine wave having a period (M×D)/K for one sampling period, on a one-to-one basis. The sampling frequency converter performs (M×D)-fold interpolation.

In this manner, the frequency converter can realized as being capable of performing multi-rate conversion and subdividing its frequency step by D.

In accordance with another aspect of the present invention, there is provided a frequency converter for converting a frequency of an input signal to an arbitrary frequency. The frequency converter comprises a polyphase structure filter for multiplying M polyphase filters each having as a coefficient a code calculated by dividing M codes (where M is a positive integer) by M, by M signals obtained by sampling a signal having a period K of a sine wave having a period M/K for one sampling period, on a one-to-one basis; and a sampling frequency converter with a conversion ratio M; wherein the input signal is correlated with the code.

In this manner, the frequency converter performs despreading and frequency conversion on a received spread signal.

In accordance with further another aspect of the present invention, there is provided a frequency converter for converting a frequency of an input signal to an arbitrary frequency. The frequency converter includes a polyphase structure filter having M polyphase filters with N=L/M coefficients determined by dividing L coefficients by M (where L and M are both a positive integer). The polyphase filter includes a coefficient bank for switching one bank each time M input discrete time sequences are received, and assigning P kinds (where P is a positive integer larger than 2) of filter coefficient sequences to multipliers of the polyphase filters one by one. The coefficient bank of an $M^{th}$ polyphase filter provides P kinds of coefficient sequences for the $M^{th}$ polyphase filter among P kinds of a total of M phase coefficients calculated by multiplying coefficients determined by repeating M original phase coefficient sequences of the polyphase filter P times in a phase direction by P×M signals determined by sampling signals for a period K of a sine wave having a period P×M/K for one sampling period, on a one-to-one basis.

In this manner, the frequency converter improves its frequency step (frequency resolution) P times without changing the number of samplings and operations, and without an increase in power consumption.

BRIEF DESCRIPTION OF THE DRAWINGS

The above and other objects, features and advantages of the present invention will become more apparent from the following detailed description when taken in conjunction with the accompanying drawings in which.

Figure 11A:
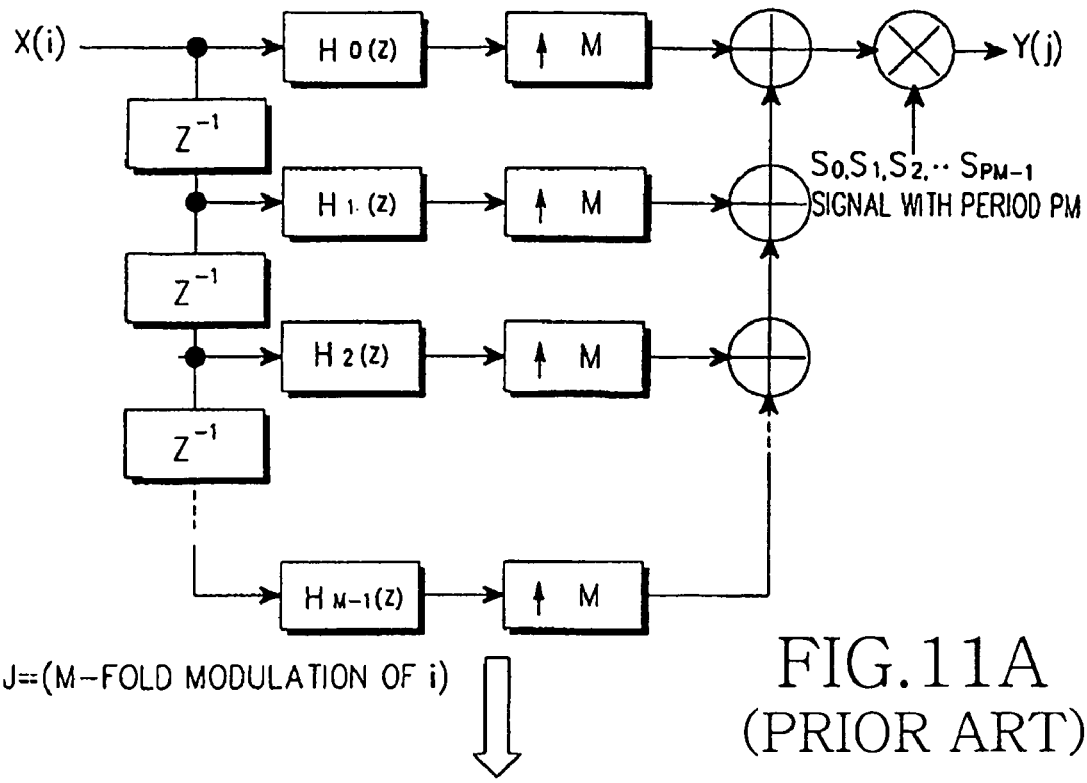
Figure 11B:
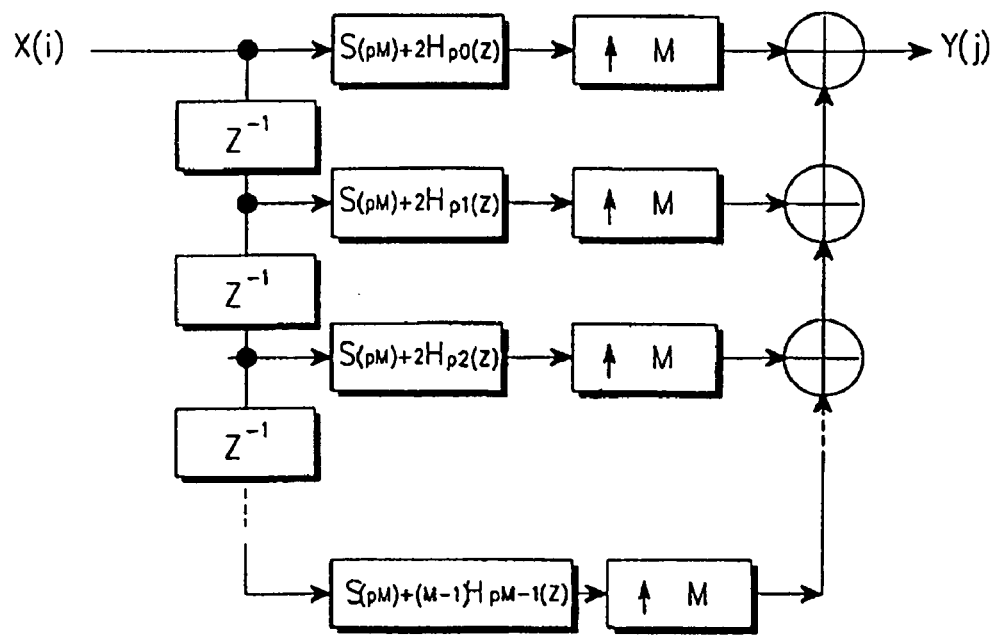
Figure 12:
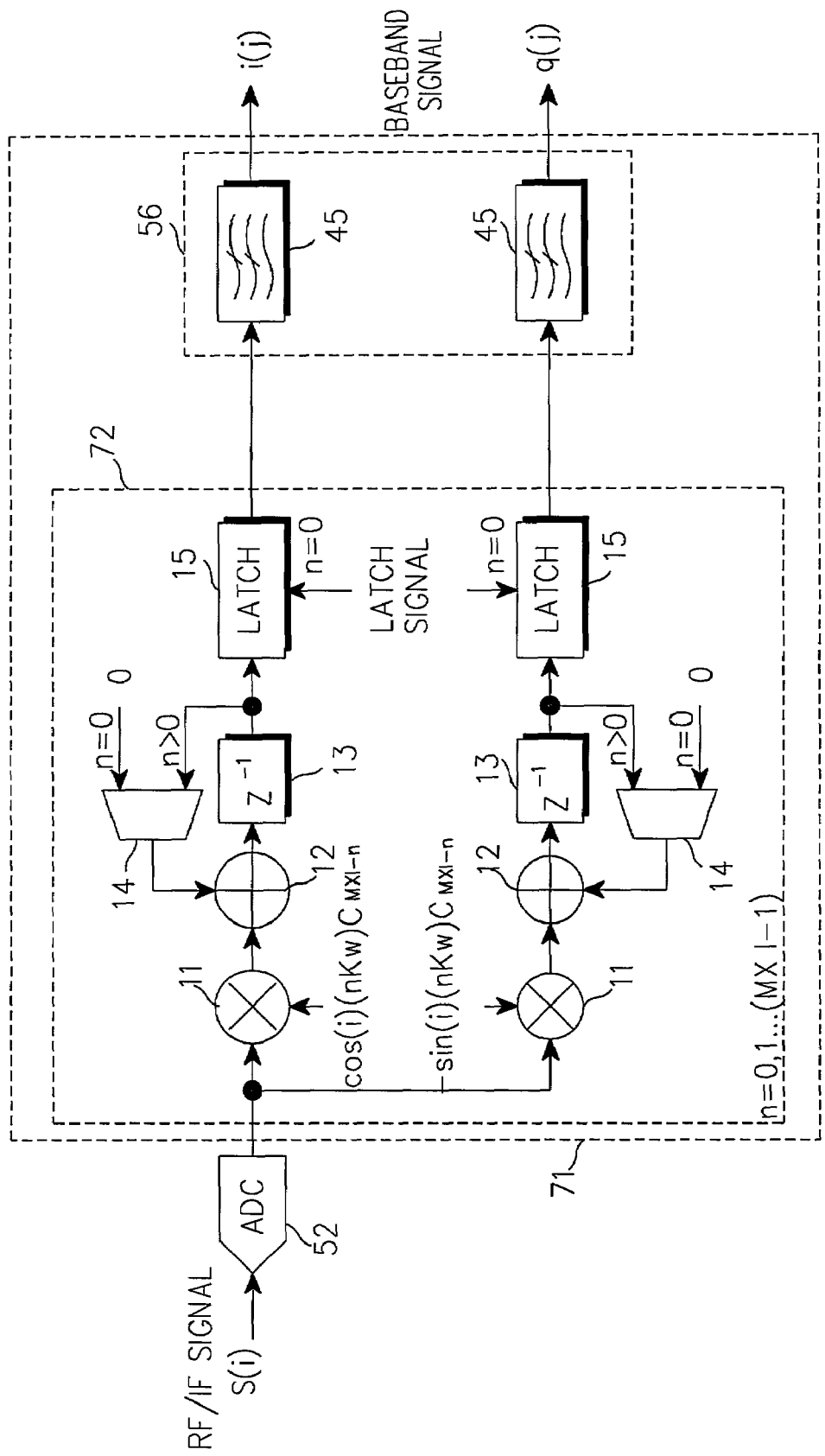
Figure 13:
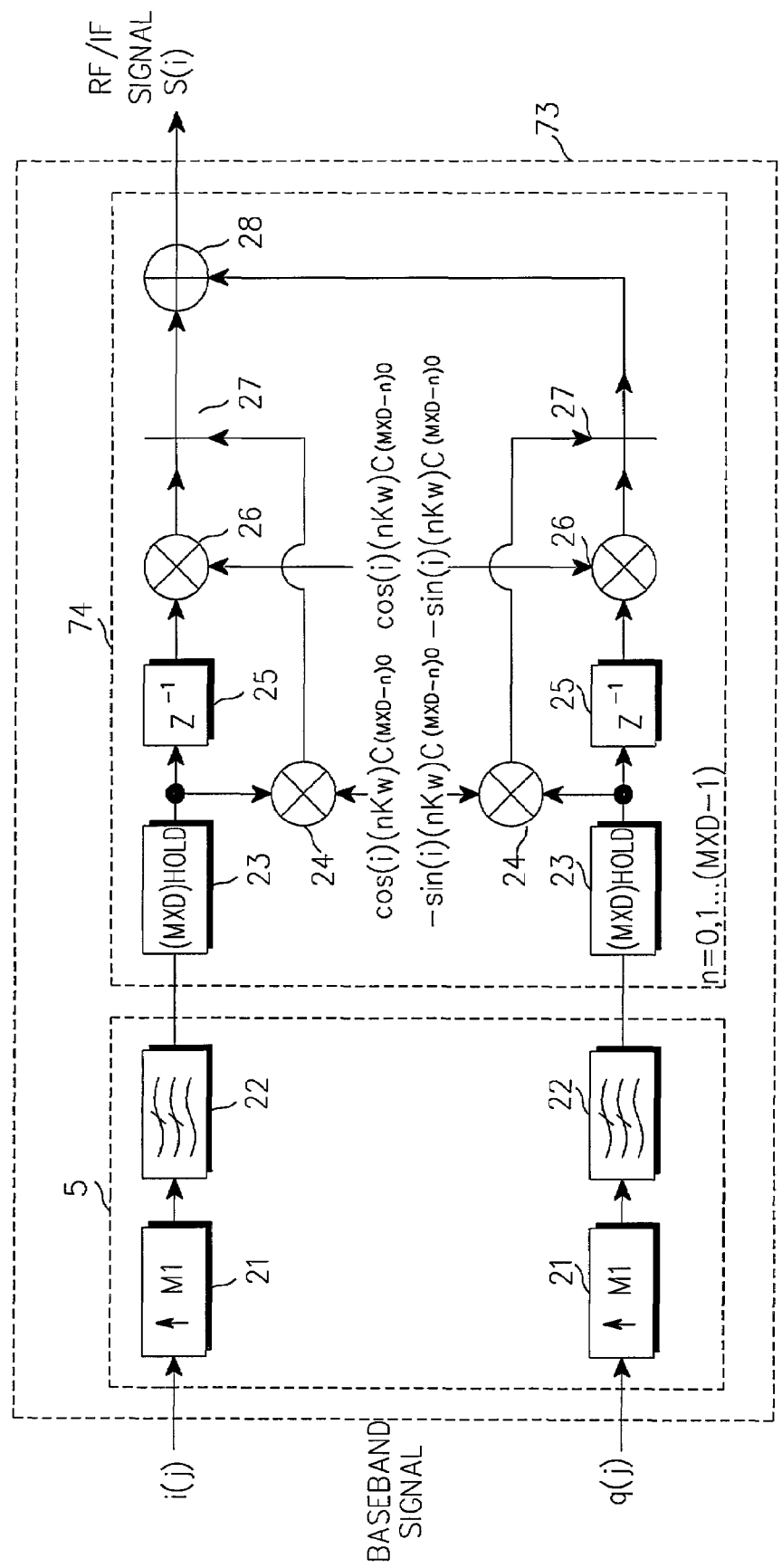

10B illustrates a fundamental structure of a decimator/mixer according to another embodiment of the present invention;

FIG. 11A illustrates a conventional polyphase structure interpolator in which a multiplier for multiplying an output of the conventional polyphase interpolator by a signal with a period PM is arranged at a final stage;

FIG. 11B illustrates a fundamental structure of an interpolator/mixer according to another embodiment of the present invention;

FIG. 12 is a block diagram illustrating a circuit structure of a digital down-converter according to a fourth embodiment of the present invention; and FIG. 13 is a block diagram illustrating a circuit structure of a digital up-converter according to a fifth embodiment of the present invention.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

A fundamental structure of a decimator/mixer and an interpolator/mixer used in a frequency converter according to first to third embodiments of the present invention will be described with reference to FIGS. 4A, 4B, 5A, and 5B. A polyphase structure decimator or interpolator for down-sampling an input signal according to the first to third embodiments of the present invention multiplies an $n^{th}$ coefficient $C_{mn}$ of an $m^{th}$ phase of a polyphase filter having N coefficients determined by dividing the decimator or interpolator by M, by an $m^{th}$ value $\cos(m\omega)$ or $-\sin(m\omega)$ of a cosine or sine signal, thereby to provide a decimation or interpolation function and a mixing function. Therefore, it is possible to construct a frequency converter comprised of only filters excluding mixers.

That is, the following filter coefficients having N coefficients at every phase M where original filter coefficients are associated with polyphase filter coefficients on an $L=M\times N$ basis are defined by performing divided-by-M polyphase resolution with L filter coefficients of $H=C_0, C_1, C_2, \ldots C_{L-1}$.

$$H_0 = C_{00}, C_{01}, C_{02} \ldots C_{0N-1}$$

$$H_1 = C_{10}, C_{11}, C_{12} \ldots C_{1N-1}$$

$$H_2 = C_{20}, C_{21}, C_{22} \ldots C_{2N-1}$$

$$\vdots$$

$$H_{M-1} = C_{M-10}, C_{M-11}, C_{M-12} \ldots C_{M-1N-1}$$

In addition, if the polyphase filter is cascaded to a multiplier (or mixer) for multiplying a sine wave $S_M$ having a period M/K (where K is a factor of M), then the processing result is equivalent to $$S_0 H_0 = S_0 C_{00}, S_0 C_{01}, S_0 C_{02}, \ldots S_0 C_{0N-1} = H'_0$$

$$S_1 H_1 = S_1 C_{10}, S_1 C_{11}, S_1 C_{12}, \ldots S_1 C_{1N-1} = H'_1$$

$$S_2 H_2 = S_2 C_{20}, S_2 C_{21}, S_2 C_{22}, \ldots S_2 C_{2N-1} = H'_2$$

$$\vdots$$

$$S_{M-1} H_{M-1} = S_{M-1} C_{M-10}, S_{M-1} C_{M-11}, S_{M-1} C_{M-12} \ldots S_{M-1} C_{M-1N-1} = H'_{M-1}$$

As to subscriptions of a filter coefficient C (e.g., subscriptions 'a' and 'b' of a filter coefficient $C_{ab}$), the subscription 'a' represents a phase direction of each polyphase filter divided into M by an integer of 0 to M−1, and the subscription 'b' represents a time direction of N polyphase filter coefficients by an integer of 0 to N−1. In addition, a subscription 'M' of a sine wave $S_M$ represents a phase direction of each polyphase filter divided into M by an integer of 0 to M−1. Further, $H_{M-1}$ represents a phase M−1.

If a multiple of a signal period of a local signal used in the mixer is identical to the number of divided polyphase filters, then M divided polyphase filters having N=L/M codes determined by dividing N coefficients (where N is a positive integer) by M (where M is a positive integer) are multiplied by M signals for each phase obtained by sampling a signal of a period K of a local signal (sinusoidal wave) having a period M/K for one sampling period on a one-to-one basis, so that it is possible to simultaneously perform multiplication of the mixer through a sum-of-product process of the polyphase structure filter. In addition, sampling frequency conversion can also be simultaneously performed at a sampling frequency ratio M.

Figure 4A:
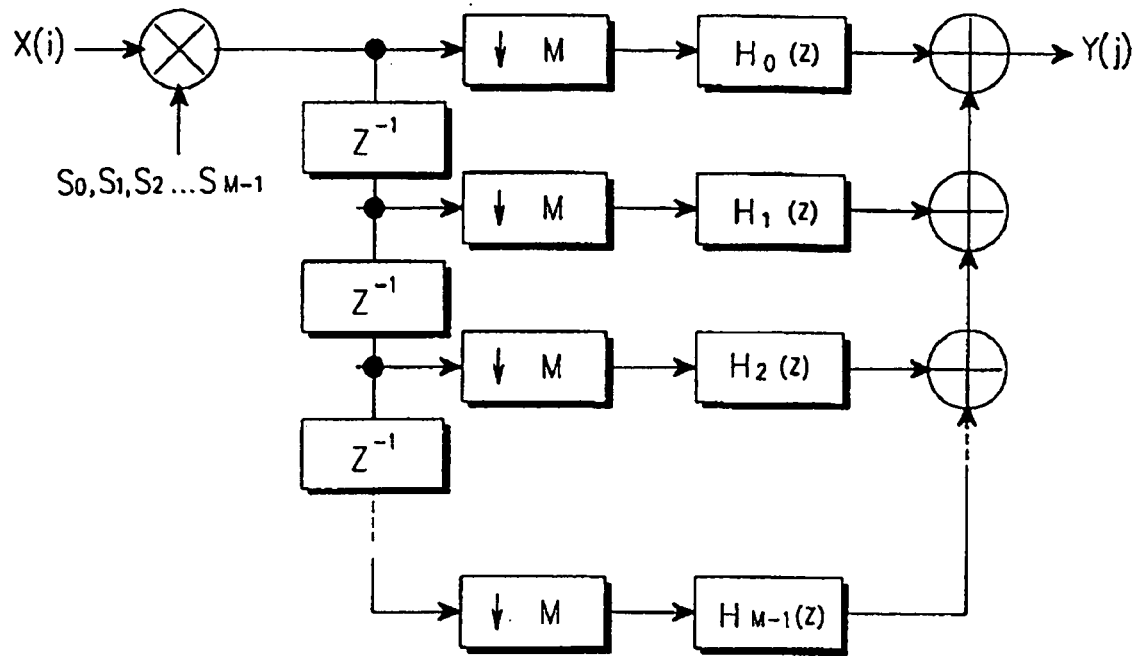
FIG. 4A illustrates a conventional polyphase structure decimator in which a multiplier for multiplying an input by a signal with a period M is arranged in an initial stage.
Figure 4B:
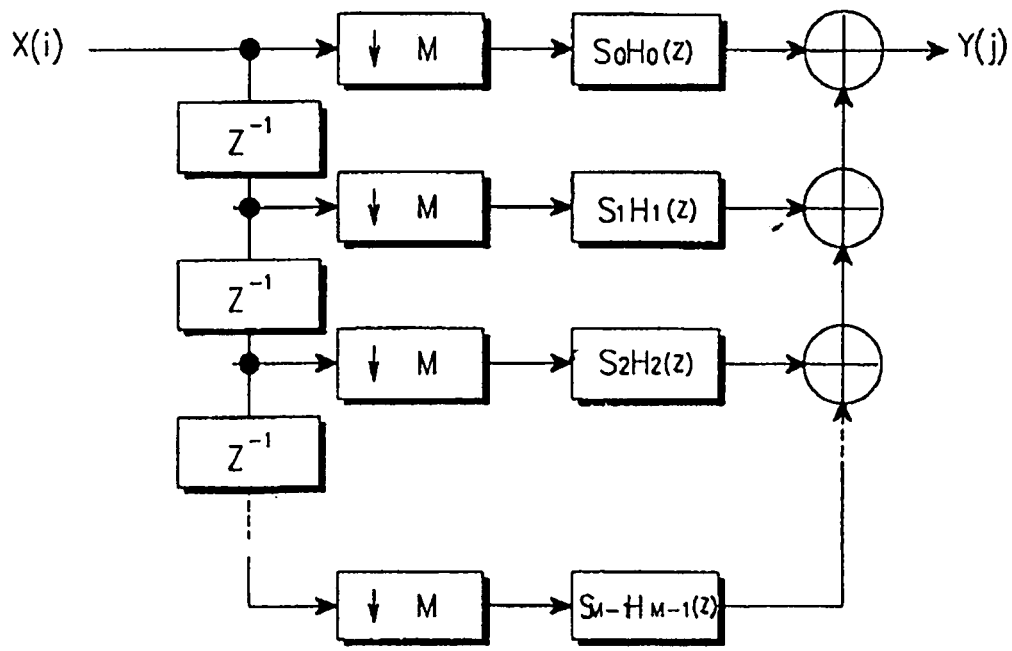
FIG. 4B illustrates a fundamental structure of a decimator/mixer realizing the polyphase decimator of FIG. 4A according to an embodiment of the present invention.

FIG. 4A illustrates a conventional polyphase structure decimator in which a multiplier for multiplying an input by a signal with a period M is arranged in an initial stage, and FIG. 4B illustrates a fundamental structure of a decimator/mixer realizing the polyphase decimator of FIG. 4A according to an embodiment of the present invention. In FIG. 4B, filters are formed using new polyphase filters in which the polyphase filters $H_0(z)$, $H_1(z)$, $H_2(z)$, ... $H_{M-1}(z)$ are multiplied by signals $S_0, S_1, S_2, \ldots S_{M-1}$ corresponding to respective phases of a signal with a phase M.

Figure 5A:
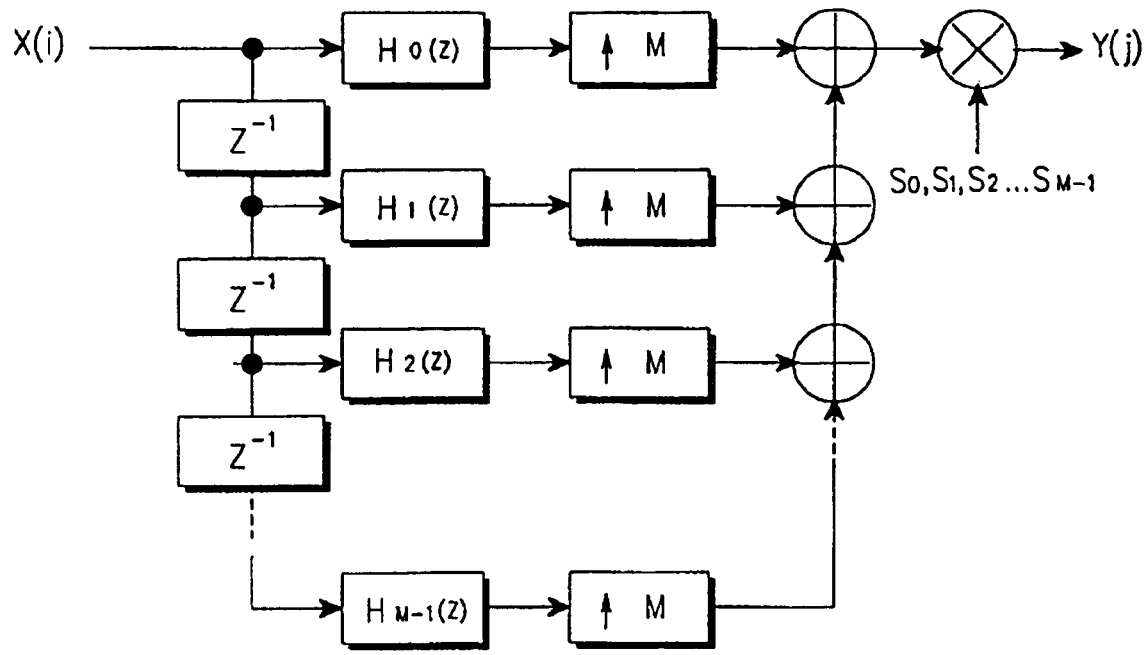
FIG. 5A illustrates a conventional polyphase structure interpolator in which a multiplier for multiplying an output of a conventional polyphase interpolator by a signal with a period M is arranged at a final stage.
Figure 5B:
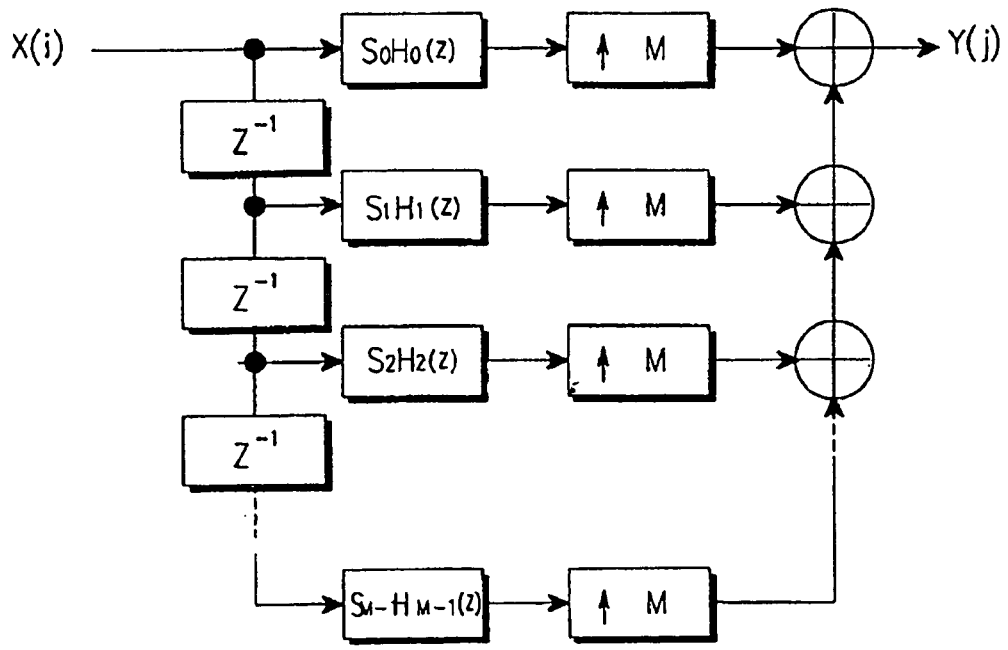
FIG. 5B illustrates a fundamental structure of an interpolator/mixer realizing the polyphase interpolator of FIG. 5A according to an embodiment of the present invention.

Likewise, FIG. 5A illustrates a conventional polyphase structure interpolator in which a multiplier for multiplying an output of the conventional polyphase interpolator by a signal with a period M is arranged at a final stage, and FIG. 5B illustrates a fundamental structure of an interpolator/mixer realizing the polyphase interpolator of FIG. 5A according to an embodiment of the present invention. In FIG. 5B, filters are formed using new polyphase filters in which the polyphase filters $H_0(z)$, $H_1(z)$, $H_2(z)$, ... $H_{M-1}(z)$ are multiplied by signals $S_0, S_1, S_2, \ldots S_{M-1}$ corresponding to respective phases of a signal with a phase M.

Embodiment 1

Figure 6:
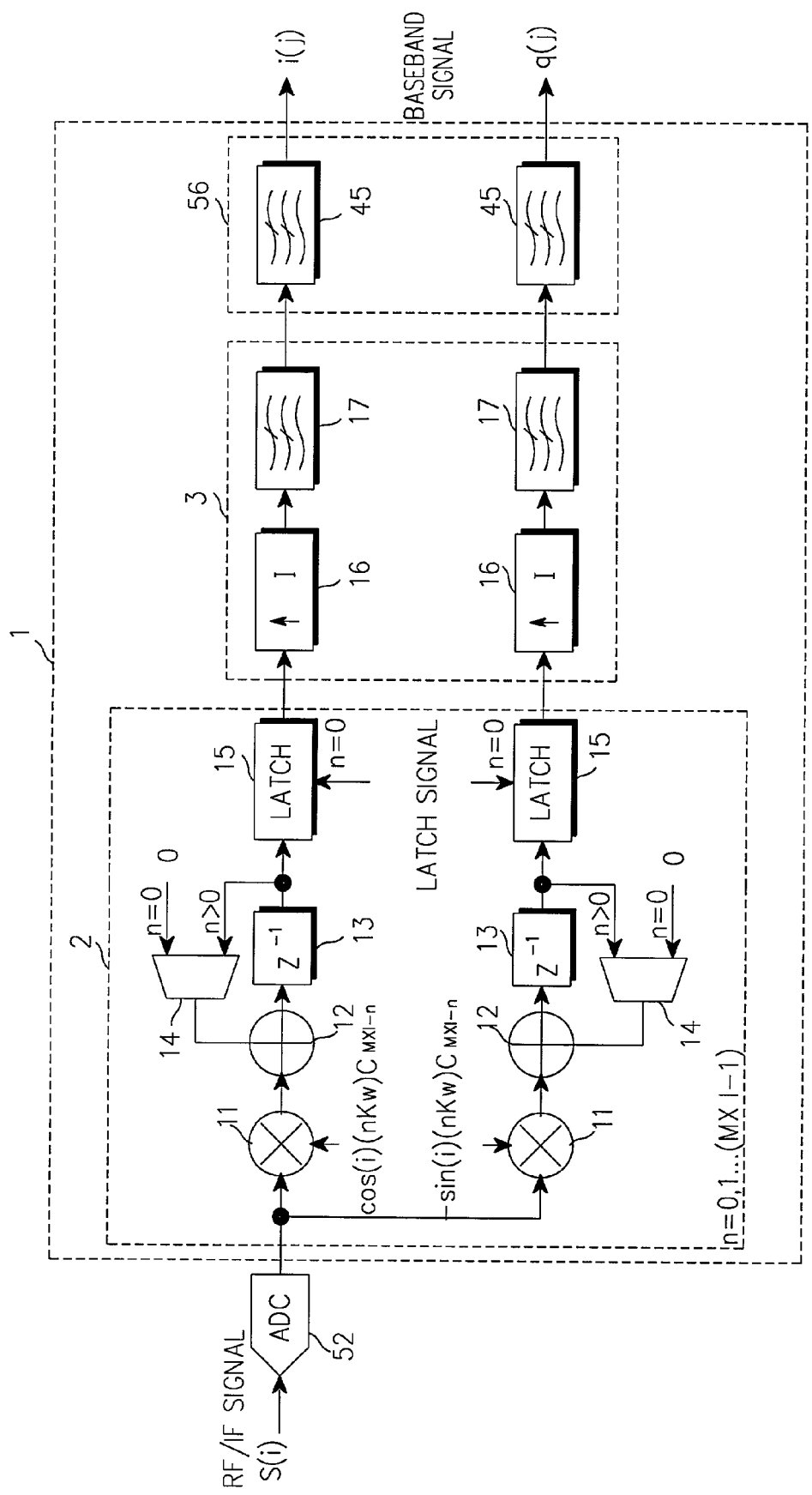
FIG. 6 is a block diagram illustrating a circuit structure of a digital down-converter according to the first embodiment of the present invention.
Figure 7:
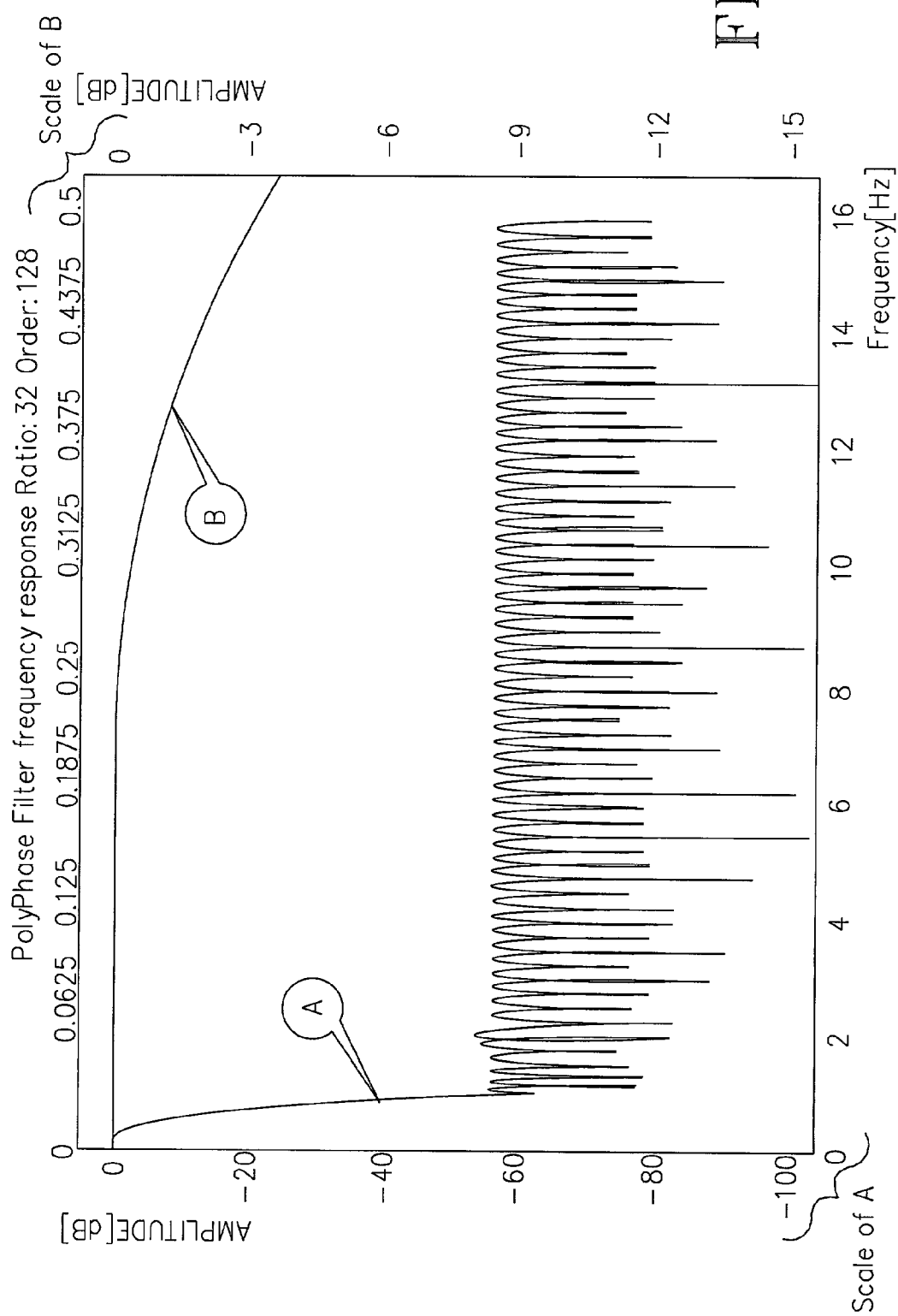
FIG. 7 illustrates a frequency characteristic of an input/output signal of the digital down-converter.

A frequency converter according to a first embodiment of the present invention will be described with reference to FIGS. 6 and 7. FIG. 6 is a block diagram illustrating a circuit structure of a digital down-converter according to the first embodiment of the present invention, and FIG. 7 illustrates a frequency characteristic of an input/output signal of the digital down-converter. This embodiment provides a structure of polyphase filters having one coefficient calculated by dividing M×I coefficients by M×I, in which multipliers for the polyphase filters are arranged to be common to respective phases of the polyphase filters and to change ROM (Read Only Memory) data comprised of filter coefficients and sine wave data at every phase.

Referring to FIG. 6, a digital down-converter 1 according to the first embodiment of the present invention includes a decimator/mixer 2, an interpolator 3 and a channel filter 56. The decimator/mixer 2 performs quadrature conversion (quadrature demodulation) from a real signal to complex signals, frequency conversion by a frequency Kω, and 1/(M×I)-fold decimation on a signal obtained by sampling an RF/IF signal S(i) by an A/D converter 52. The interpolator 3 is comprised of I-fold up-samplers 16 and lowpass filters 17, and performs I-fold interpolation on the outputs from the decimator/mixer 2. The channel filter 56 is comprised of lowpass filters 45 having a band characteristic given to a communication channel, and outputs band-rejected baseband signals i(j) and q(j) by filtering the outputs of the interpolator 3.

The decimator/mixer 2 includes multipliers 11 for multiplying a received real signal by signals $\cos(nK\omega)C_{M\times I-n}$ and $-\sin(nK\omega)C_{M\times I-n}$ (where n=0, 1, ... (M×I−1)), respectively, adders 12, delays 13, multiplexers 14, and latches 15. The adders 12 add output signals of the multipliers 11 to signals fed back from the multiplexers 14 after being delayed by the delays 13, and then provide their outputs to the delays 13, thus implementing an integrator for accumulation. By doing so, the decimator/mixer 2 simultaneously performs band rejection by a filter coefficient $C_{M \times I-n}$ and frequency conversion of fs1/(M×I)×K by multiplying an input sampling frequency fs1 by signals cos(nKω)) and −sin(nKω), and outputs the accumulated signals through the latches 15 once every (M×I) times when n=0, thereby performing 1/(M×I)-fold decimation on the input signal of a sampling frequency fs1 with a sampling frequency fs2. In addition, the multiplexers 14 feed back a signal '0' to the adders 12 once every (M×I) times when n=0, thereby resetting the accumulation. The reason for using the filter coefficient $C_{M \times I-n}$ instead of $C_n$ is because the filter performs a convolution operation. Therefore, the embodiment realizes an I/(M×I)=1/M-fold decimator by performing I-fold interpolation after 1/(M×I)-fold decimation/mixing, and subdivides a frequency step used for frequency conversion by I by increasing polyphase division on the decimator/mixer I times in order to correct I-fold interpolation.

Figure 1:
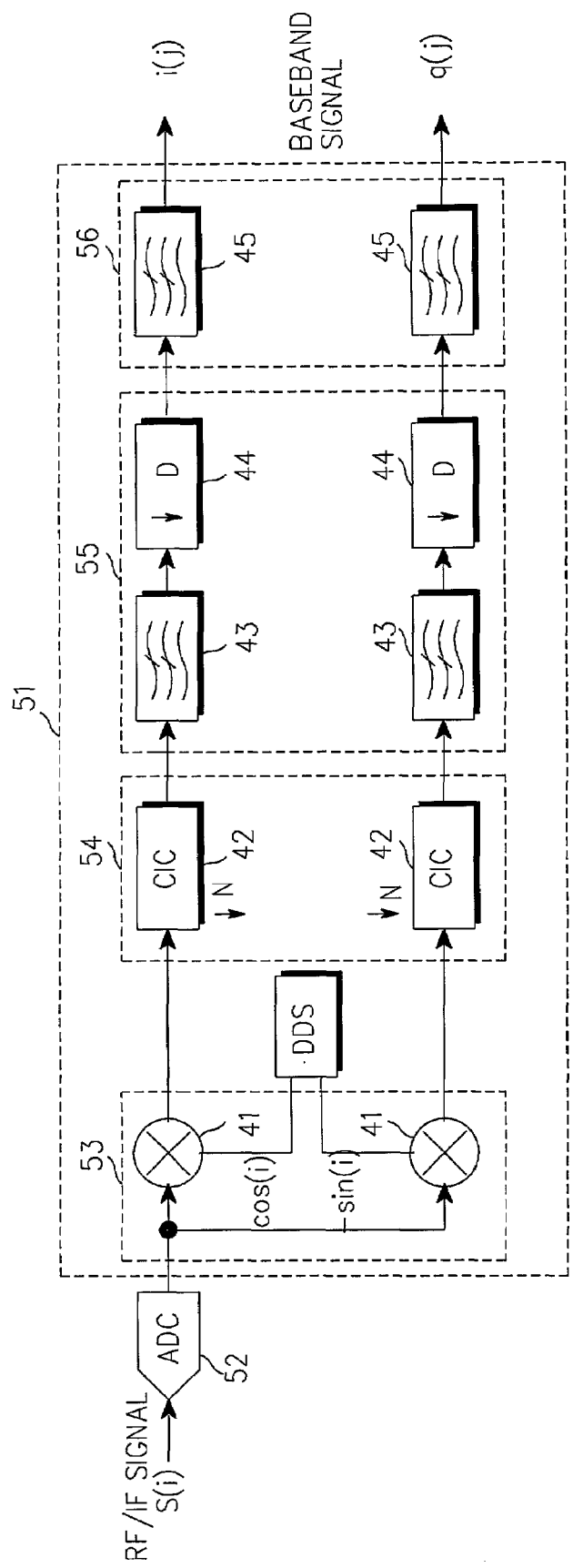
FIG. 1 illustrates a circuit structure of a conventional digital down-converter.
Figure 2:
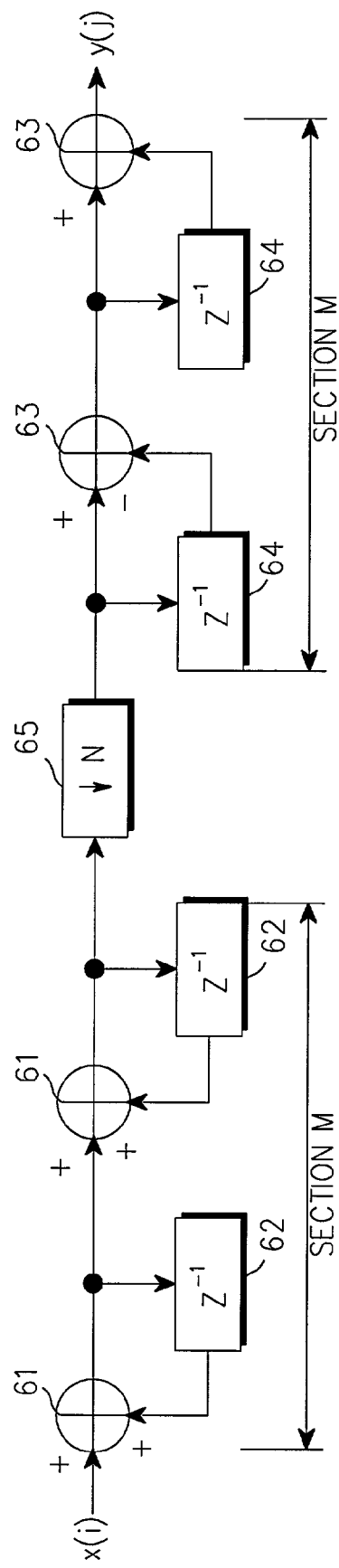
FIG. 2 illustrates a detailed structure of the CIC filter shown in FIG. 1.
Figure 3:
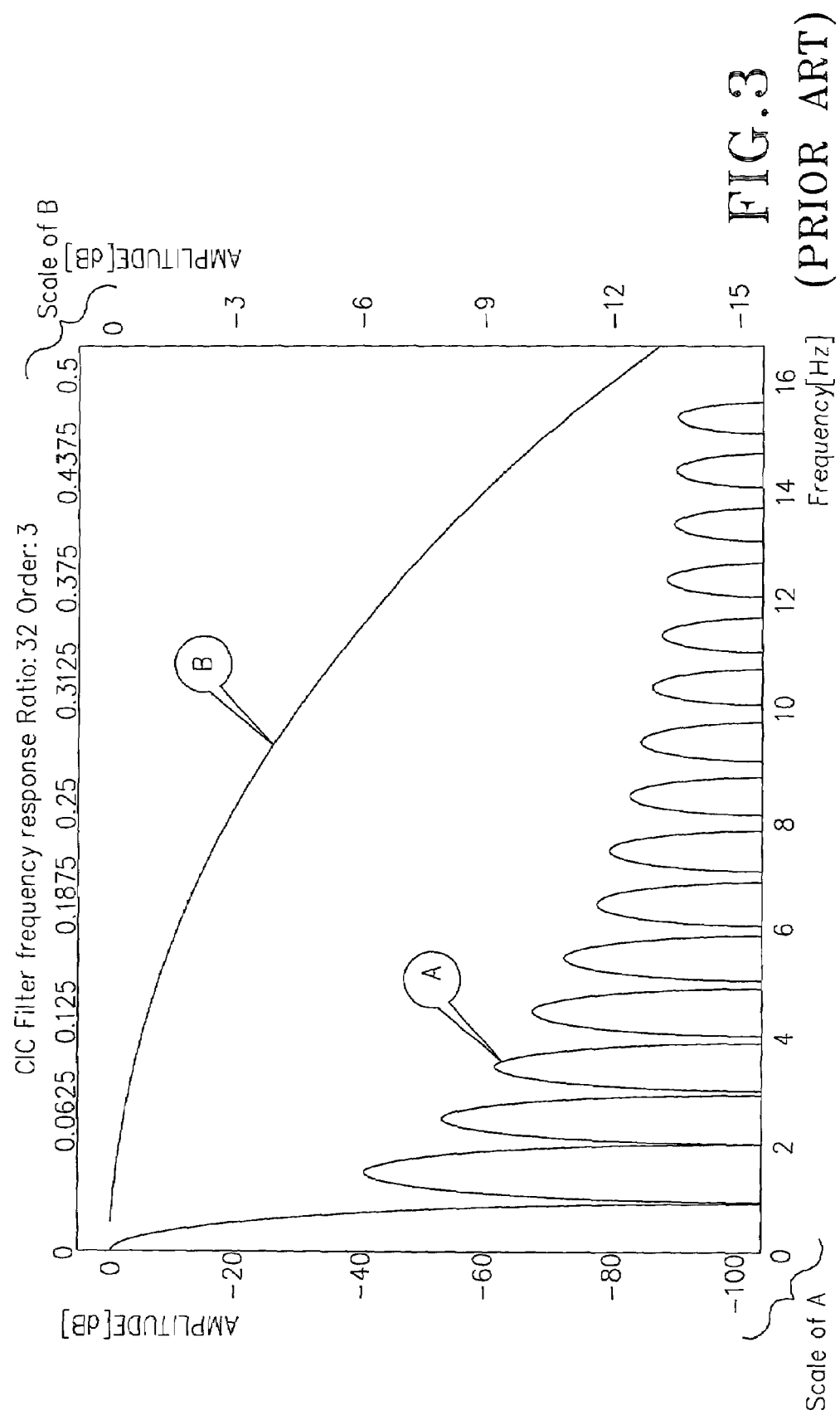
FIG. 3 illustrates an input/output frequency characteristic of the conventional digital down-converter.

FIG. 7 illustrates an input/output frequency characteristic curve A when a decimation ratio is M×I=128 in the digital down-converter according to an embodiment of the present invention. A characteristic curve B is a graph given by expanding a frequency axis of the characteristic curve A. Referring to FIG. 7, compared with the input/output frequency characteristic of the CIC filter shown in FIG. 3, an input/output frequency characteristic of the digital down-converter according to the present invention is remarkably improved in both the pass band and the rejection band. Therefore, even when processing a wideband signal, it is possible to obtain an excellent frequency characteristic and aliasing suppression characteristic.

Embodiment 2

Figure 8:
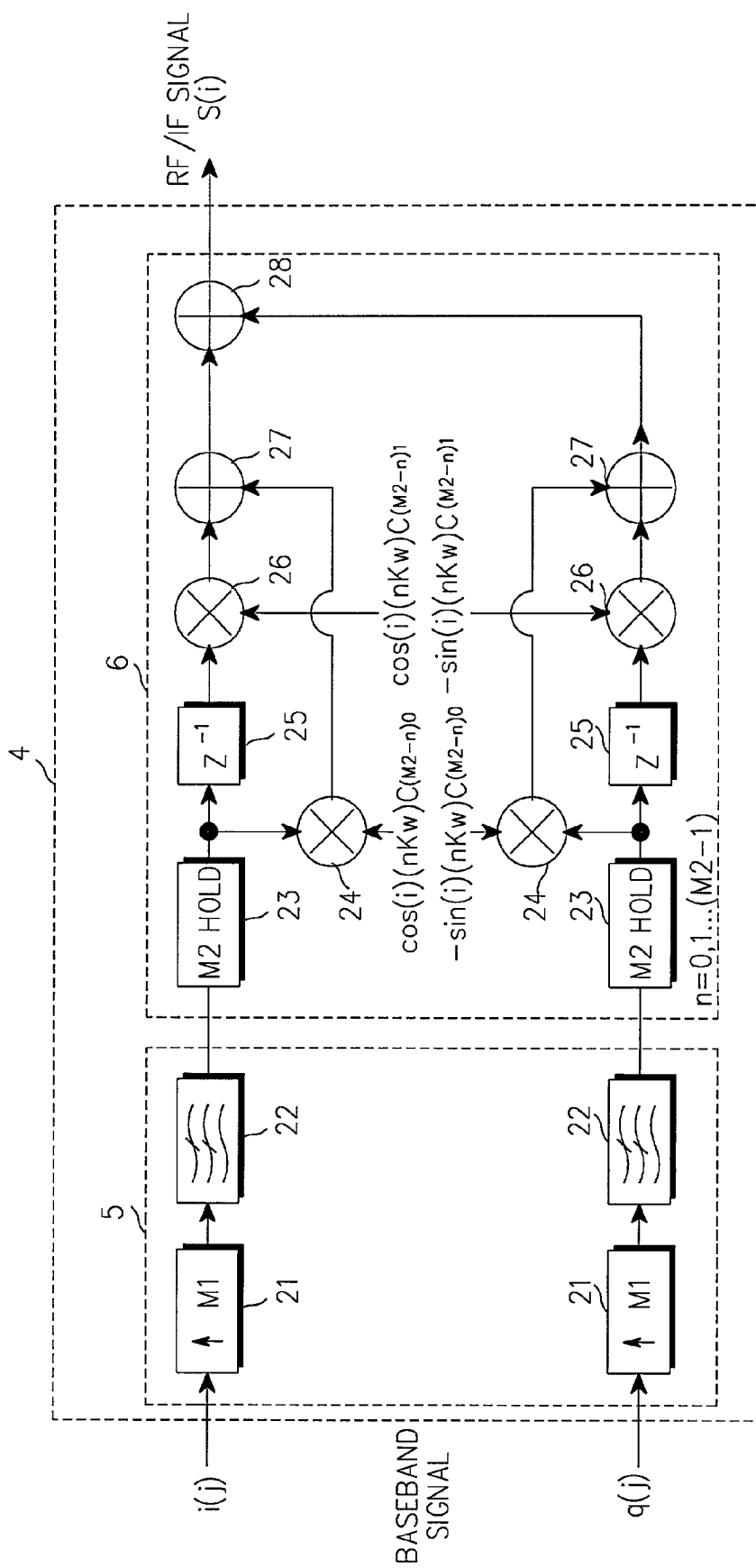
FIG. 8 is a block diagram illustrating a circuit structure of a digital up-converter according to a second embodiment of the present invention.

Next, a frequency converter according to a second embodiment will be described with reference to FIG. 8. FIG. 8 is a block diagram illustrating a circuit structure of a digital up-converter according to the second embodiment of the present invention. This embodiment provides a polyphase filter having two coefficients obtained by dividing 2×M2 coefficients by M2, in which multipliers and delays for the polyphase filters are arranged to be common to respective phases of the polyphase filters and to change ROM data comprised of filter coefficients and sine wave data at every phase.

Referring to FIG. 8, a digital up-converter 4 according to the second embodiment of the present invention includes an interpolator 5 and an interpolator/mixer 6. The interpolator 5 is comprised of M1-fold up-samplers 21 and lowpass filters 22, and performs M1-fold interpolation on received complex signals i(j) and q(j). The interpolator/mixer 6 performs frequency conversion by a frequency Kω, M2-fold interpolation, and quadrature conversion from the received complex signals to a real signal, on the outputs of the interpolator 5, thereby outputting an RF/IF signal S(i). The interpolator/mixer 6 is comprised of hold circuits 23 for holding the received complex signals for a time M2, multipliers 24, delays 25, multipliers 26 and adders 27, constituting a 2-step FIR filter which performs a sum-of-product operation by multiplying the input signals by signals cos(nKω)$C_{(M2-n)0}$ and −sin(nKω)$C_{(M2-n)0}$, and signals cos(nKω)$C_{(M2-n)1}$ and −sin(nKω)$C_{(M2-n)1}$, where n=0, 1, . . . (M2−1).

The hold circuits 23 are multi-output circuits for outputting (up-sampling) the same sample M2 in a sampling period of the input signal. The hold circuits 23 simultaneously perform band rejection on held signals by filter coefficients $C_{(M2-n)0}$ and $C_{(M2-n)1}$, and frequency conversion of fs1/M2×K by multiplying an input sampling frequency fs1 by signals cos(nKω) and −sin(nKω), and also perform M2-fold interpolation on the input signal of sampling frequency fs1 with a sampling frequency fs2 by outputting signals once every 1/M2 times. Further, an adder 28 adds a real signal obtained by multiplying a real signal of the received complex signals by the cos signal to a new real signal created by multiplying an imaginary signal of the received complex signals by the −sin signal, thereby performing quadrature conversion (quadrature modulation) of converting the complex signals to a real signal. In addition, the reason for using the filter coefficient $C_{(M2-n)}$ instead of $C_n$ is because the filter performs a convolution operation. Therefore, the embodiment realizes free frequency conversion and sampling frequency conversion by an M1-fold interpolator and an M2-fold polyphase structure interpolator.

Embodiment 3

Figure 9:
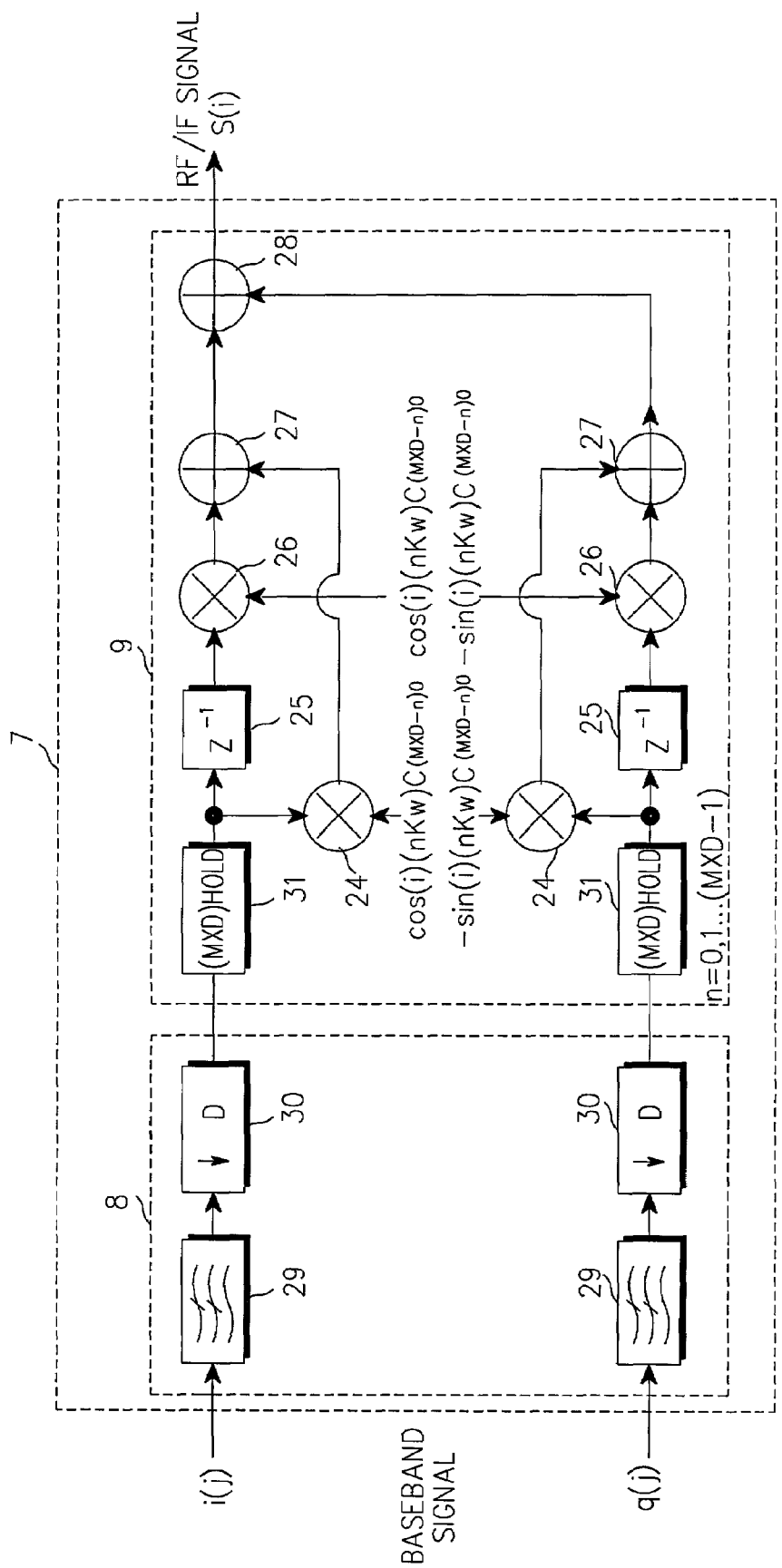
FIG. 9 is a block diagram illustrating a circuit structure of a digital up-converter according to a third embodiment of the present invention.

Next, a frequency converter according to a third embodiment will be described with reference to FIG. 9. FIG. 9 is a block diagram illustrating a circuit structure of a digital up-converter according to the third embodiment of the present invention. This embodiment provides a polyphase filter having two coefficients obtained by dividing 2×(M×D) coefficients by M×D, in which multipliers and delays for the polyphase filters are arranged to be common to respective phases of the polyphase filters and to change ROM data comprised of filter coefficients and sine wave data at every phase.

Referring to FIG. 9, a digital up-converter 7 according to the third embodiment of the present invention includes a decimator 8 and an interpolator/mixer 9. The decimator 8 is comprised of lowpass filters 29 and 1/D-fold down-samplers 30, and performs 1/D-fold decimation on received complex signals i(j) and q(j). The interpolator/mixer 9 performs frequency conversion by a frequency Kω, (M×D)-fold interpolation, and quadrature conversion from the complex signals to a real signal, on the outputs of the decimator 8, thereby outputting an RF/IF signal S(i). The interpolator/mixer 9 is comprised of hold circuits 31 for holding the received complex signals for a time (M×D), multipliers 24, delays 25, multipliers 26 and adders 27, constituting a 2-step FIR filter which performs a sum-of-product operation by multiplying the input signals by signals cos(nKω)$C_{(M \times D-n)0}$ and −sin(nKω)$C_{(M \times D-n)0}$, and signals cos(nKω)$C_{(M \times D-n)1}$ and −sin(nKω)$C_{(M \times D-n)1}$, where n=0, 1, . . . (M×D−1).

The hold circuits 31 are multi-output circuits for outputting (up-sampling) the same sample M×D in a sampling period of the input signal. The hold circuits 31 simultaneously perform band rejection on the held signal by filter coefficients $C_{(M \times D-n)0}$ and $C_{(M \times D-n)1}$, performs frequency conversion of fs1/(M×D)×K by multiplying an input sampling frequency fs1 by signals cos(nKω) and −sin(nKω), and also perform (M×D)-fold interpolation on the input signal of a sampling frequency fs1 with a sampling frequency fs2 by outputting signals once every 1/(M×D) times. Further, an adder 28 adds a real signal obtained by multiplying a real signal of the received complex signals by the cos signal to a new real signal created by multiplying an imaginary signal of the received complex signals by the −sin signal, thereby performing quadrature conversion (quadrature modulation) of converting the complex signals to a real signal. In addition, the reason for using the filter coefficient $C_{(M \times D - n)}$ instead of $C_n$ is because the filter performs a convolution operation. Therefore, the embodiment realizes an (M×D)/D=M-fold interpolator by performing (M×D)-fold interpolation/mixing after 1/D-fold decimation, and subdivides a frequency step used for frequency conversion by D by increasing polyphase division of the decimator/mixer D times in order to correct 1/D-fold interpolation.

Next, a description will be given as to fundamental structures of a decimator/mixer and an interpolator/mixer used for a frequency converter according to fourth and fifth embodiments of the present invention.

A polyphase structure decimator or interpolator for sampling an input signal according to fourth and fifth embodiments of the present invention converts a decimator or interpolator into P×M polyphase filters by repeating P times M polyphase filters each having N coefficients in a phase direction, and multiplies an $n^{th}$ coefficient $C_{mn}$ of an $m^{th}$ phase of the converted polyphase filters by an $m^{th}$ value $\cos(m\omega)$ or $-\sin(m\omega)$ of a cosine or sine signal, thereby to provide a decimation or interpolation function and a mixing function, and to improve a frequency step (or frequency resolution) of the mixer.

That is, the following filter coefficients having N coefficients at every phase M, where original filter coefficients are associated with polyphase filter coefficients on an L=M×N basis, are defined by performing divided-by-M polyphase resolution with L filter coefficients of $H = C_0, C_1, C_2, \ldots C_{L-1}$.

$$H_0 = C_{00}, C_{01}, C_{02} \ldots C_{0N-1}$$

$$H_1 = C_{10}, C_{11}, C_{12} \ldots C_{1N-1}$$

$$H_2 = C_{20}, C_{21}, C_{22} \ldots C_{2N-1}$$

$$\vdots$$

$$H_{M-1} = C_{M-10}, C_{M-11}, C_{M-12} \ldots C_{M-1N-1}$$

Next, if the filter coefficients are converted into P×M filter coefficients by repeating the M polyphase filters P times (where P is an integer higher than 2) in a phase direction and the polyphase filters are multiplied on a one-to-one basis by sine waves $S_m$ (m=0,1,2 … P×M−1) having a period P×M/K (where K is a factor of P×M), then the processing result is equivalent to As to subscriptions 'e' and 'f' of a filter coefficient $C_{ef}$, the subscription the subscription 'e' represents a phase direction of each polyphase filter divided into M by an integer of 0 to M−1, and the subscription 'f' represents a time direction of N polyphase filter coefficients by an integer of 0 to N−1. In addition, as to subscriptions of a sine wave $S_{(vM)+w}$, the subscription 'v' represents the number of repetitions of the polyphase filters which are repeated P times by an integer of 0 to P−1, and the subscription 'w' represents a phase direction of each polyphase filter divided into M by an integer of 0 to M−1. $S_{(PM)-1}$ indicates a case where v=P−1 and w=M−1, and $H_{P-1M-1}$ indicates a phase M−1 for a $P^{th}$ repetition.

If a multiple of a signal period of a local signal used in the mixer is identical to the number P (where P is a positive number larger than 2) of divided polyphase filters, then it is possible to create P×M coefficient groups by repeating the M polyphase filters having N=L/M codes as coefficients, determined by dividing L coefficients (where L is a positive integer) by M (where M is a positive integer), P times in a phase direction, and also create new coefficient groups by multiplying the created coefficient groups by P×M phase signals determined by sampling signals for a period K of a local signal (sine wave) with a period P×M/K for one sampling period, on a one-to-one basis.

The coefficient groups are sequentially assigned to the M polyphase filters one by one from the frontmost one, and each polyphase filter is assigned P kinds of coefficient groups selected every M coefficient groups for M phases of the polyphase filter. In the polyphase filter, the P kinds of coefficient groups are P kinds of coefficient banks, and the coefficient banks are switched one by one each time M discrete time sequences are received. By doing so, a mixer's multiplication process of improving the frequency step (frequency resolution) P times by the sum-of-product process of the polyphase structure filter is simultaneously performed. Also, sampling frequency conversion is simultaneously performed at a sampling frequency ratio M.

Figure 10A:
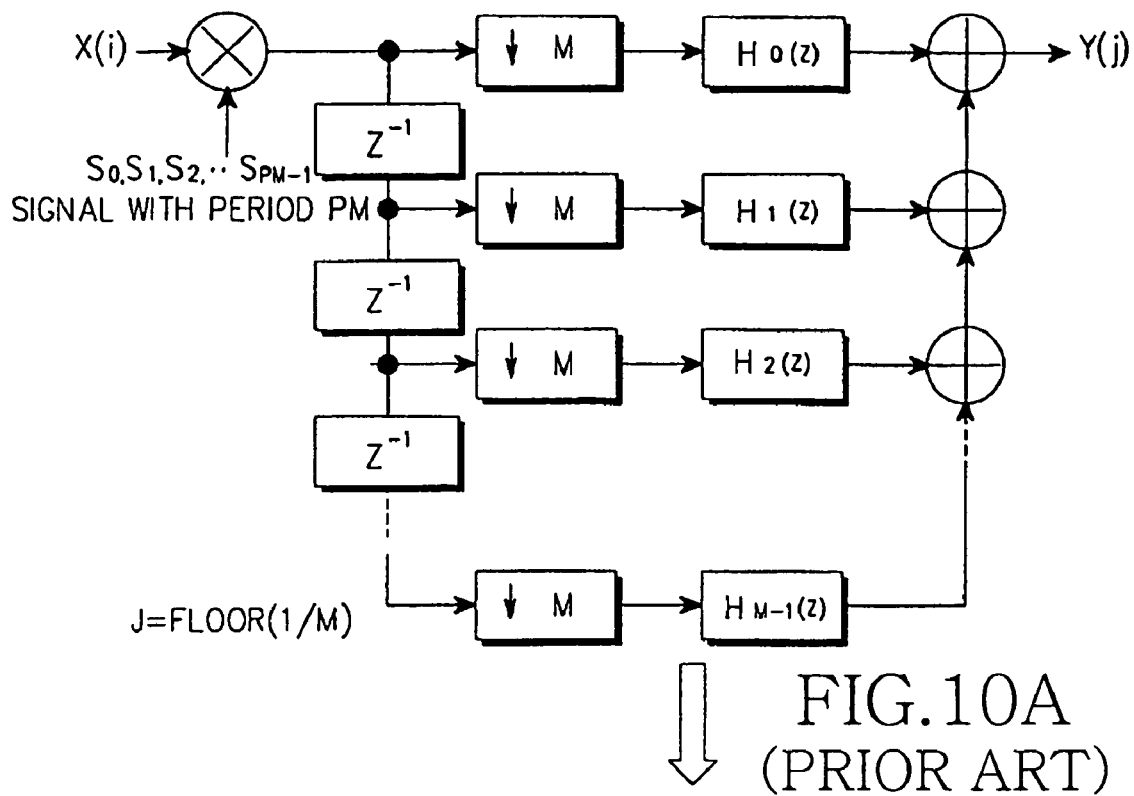
FIG. 10A illustrates a conventional polyphase structure decimator in which a multiplier for multiplying an input by a signal with a period PM is arranged in an initial stage.
Figure 10B:
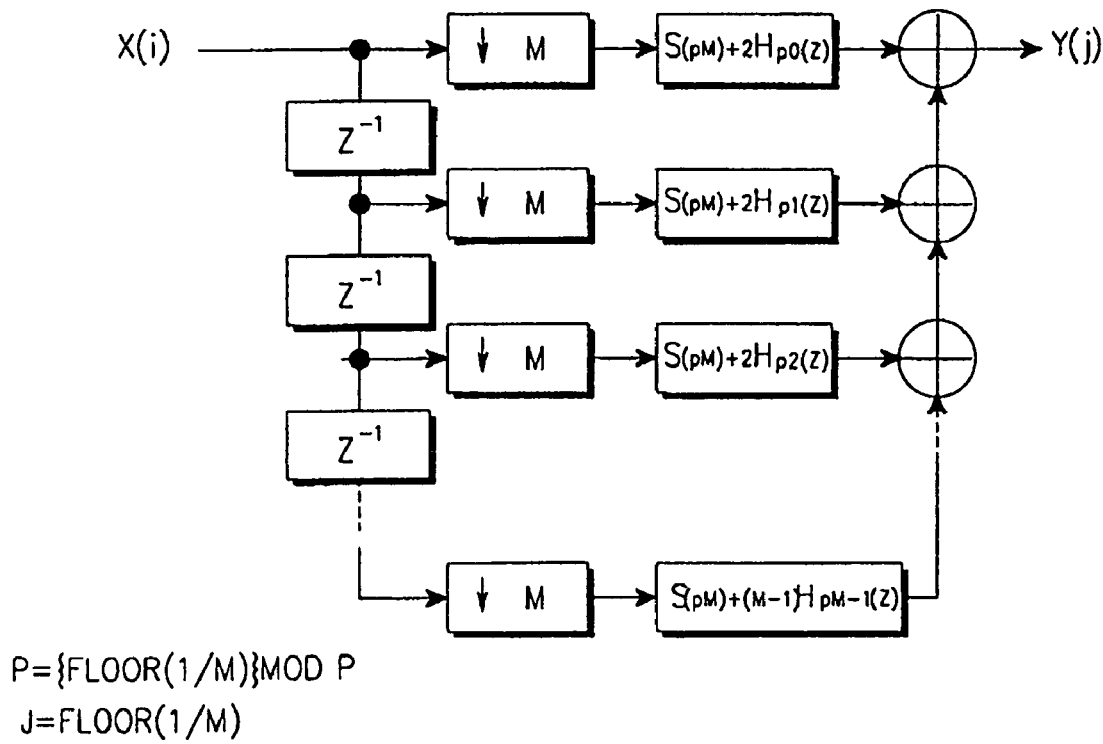

FIG. 10A illustrates a conventional polyphase structure decimator in which a multiplier for multiplying an input by a signal with a period PM is arranged in an initial stage, and FIG. 10B illustrates a fundamental structure of a decimator/mixer realizing the polyphase decimator of FIG. 10A according to an embodiment of the present invention. In FIG. 10B, filters are formed using new polyphase filters in which new filter coefficients determined by repeating the polyphase filters $H_0(z), H_1(z), H_2(z), \ldots H_{M-1}(z)$ P times in the phase direction are multiplied by signals $S_0, S_1, S_2, \ldots S_{PM-1}$ corresponding to respective phases of a signal with a phase PM.

$$S_{(0 \times M)+0} H_{00} = S_{(0 \times M)+0} C_{00}, S_{(0 \times M)+0} C_{01}, S_{(0 \times M)+0} C_{02}, \ldots S_{(0 \times M)+0} C_{0N-1} = H'_{00}$$

$$S_{(0 \times M)+1} H_{01} = S_{(0 \times M)+1} C_{10}, S_{(0 \times M)+1} C_{11}, S_{(0 \times M)+1} C_{12}, \ldots S_{(0 \times M)+1} C_{1N-1} = H'_{01}$$

$$S_{(0 \times M)+2} H_{02} = S_{(0 \times M)+2} C_{20}, S_{(0 \times M)+2} C_{01}, S_{(0 \times M)+2} C_{22}, \ldots S_{(0 \times M)+2} C_{2N-1} = H'_{02}$$

$$\vdots$$

$$S_{(1 \times M)+0} H_{10} = S_{(1 \times M)+0} C_{00}, S_{(1 \times M)+0} C_{01}, S_{(1 \times M)+0} C_{02}, \ldots S_{(1 \times M)+0} C_{0N-1} = H'_{10}$$

$$S_{(1 \times M)+1} H_{11} = S_{(1 \times M)+1} C_{10}, S_{(1 \times M)+1} C_{11}, S_{(0 \times M)+1} C_{12}, \ldots S_{(1 \times M)+1} C_{1N-1} = H'_{11}$$

$$S_{(1 \times M)+2} H_{12} = S_{(1 \times M)+2} C_{20}, S_{(1 \times M)+2} C_{21}, S_{(1 \times M)+2} C_{22}, \ldots S_{(1 \times M)+2} C_{2N-1} = H'_{12}$$

$$S_{(PM)-1} H_{P-1M-1} = S_{(PM)-1} C_{M-10}, S_{(PM)-1} C_{M-11}, S_{(PM)-1} C_{M-12} \ldots S_{(PM)-1} C_{M-1N-1} = H'_{(PM)-1M-1}$$

Likewise, FIG. 11A illustrates a conventional polyphase structure interpolator in which a multiplier for multiplying an output of the conventional polyphase interpolator by a signal with a period PM is arranged at a final stage, and FIG. 11B illustrates a fundamental structure of an interpolator/mixer realizing the polyphase interpolator of FIG. 11A according to an embodiment of the present invention. In FIG. 11B, filters are formed using new polyphase filters in which new filter coefficients determined by repeating the polyphase filters $H_0(z), H_1(z), H_2(z), \ldots H_{M-1}(z)$ P times in the phase direction are multiplied by signals $S_0, S_1, S_2, \ldots S_{PM-1}$ corresponding to respective phases of a signal with a phase PM.

The coefficient groups of $S_{(0 \times M)+0}H_{00}$ to $S_{(PM)-1}H_{P-1M-1}$ are sequentially assigned to the M polyphase filters one by one from the frontmost one, and each polyphase filter is assigned P kinds of coefficient groups selected every M coefficient groups for M phases of the polyphase filter. Coefficients p=[floor(i/M) mod P] calculated from an $i^{th}$ discrete time sequence input to the M polyphase filters defined as $S_{(pM)+(M-1)}H_{p(M-1)}$ for the coefficient groups of $S_{(0 \times M)+0}H_{00}$ to $S_{(PM)-1}H_{P-1M-1}$ are read out from the coefficient banks and subjected to convolution.

When the mixer (or frequency converter) whose frequency step frequency resolution) has been improved P times is realized by software signal processing (digital signal processing), power consumption per unit time is not increased at all, because as the number of operations in the phase direction of the polyphase structure filter increases P times, an operation time in the time direction of each polyphase filter is reduced to 1/P and the total amount (P×1/P=1) of operations per unit time is not different at all from the value before the frequency step (frequency resolution) is improved. In addition, even when the mixer is realized by hardware signal processing, there is almost no increase in the consumption power per unit time, although an operation of switching the polyphase filters every period occurs every M times of sampling.

Embodiment 4

FIG. 10 illustrates a circuit structure of a digital down-converter (DDC) according to a fourth embodiment of the present invention. A frequency converter with an improved frequency step (frequency resolution) according to the fourth embodiment will be described with reference to FIG. 10.

As mentioned above, the first embodiment performs polyphase division on the decimator/mixer I times in order to correct I-fold interpolation and subdivides its frequency step (frequency resolution) by I, in realizing I/(M×I)=1/M-fold decimator. However, the fourth embodiment uses a polyphase filter, a frequency step (frequency resolution) of which is improved I times, thereby to remove the I-fold up-samplers 16 and the lowpass filters 17 from the digital down-converter (DDC) of FIG. 6 according to the first embodiment.

Referring to FIG. 10, a digital down-converter (DDC) 71 according to the fourth embodiment of the present invention includes a decimator/mixer 72 and a channel filter 56. The decimator/mixer 72 performs quadrature conversion (quadrature demodulation) from a real signal to a complex signal, on an output signal of the A/D converter 52 for A/D-converting an RF/IF input signal S(i), and also performs a frequency conversion by a frequency Kω and 1/M-fold decimation. The channel filter 56 comprised of lowpass filters 45 having a band characteristic given in a communication channel, outputs band-rejected baseband signals i(j) and q(j).

The decimator/mixer 72 includes multipliers 11 for multiplying a received real signal by signals $\cos(nK\omega)C_{M \times I-n}$ and $-\sin(nK\omega)C_{M \times I-n}$ (where n=0, 1, . . . (M×I−1)), respectively, adders 12, delays 13, multiplexers 14, and latches 15. The adders 12 add output signals of the multipliers 11 to signals fed back from the multiplexers 14 after being delayed by the delays 13, and then provide their outputs to the delays 13, thus implementing an integrator for accumulation. By doing so, the decimator/mixer 72 simultaneously performs band rejection by a filter coefficient $C_{M \times I-n}$ and frequency conversion of fs1/(M×I)×K by multiplying an input sampling frequency fs1 by signals $\cos(nK\omega)$ and $-\sin(nK\omega)$, and outputs the accumulated signals through the latches 15 once every M times when n is a multiple of M (n={n mod M}=0), thereby performing 1/M-fold decimation on the input signal of a sampling frequency fs1 with a sampling frequency fs2. In addition, the multiplexers 14 feed back a signal '0' to the adders 12 once every M times when n is a multiple of M (n={n mod M}=0), thereby resetting the accumulation. The filter coefficients $C_{M \times I-n}$ are coefficients for I×M polyphase filters determined by repeating M polyphase filters having N=L/M codes I times in the phase direction, where L and M are both a positive integer. In this manner, it is possible to realize a structure of switching, every M times, I kinds of coefficient banks of a polyphase filter determined by repeating I times one coefficient determined by dividing M coefficients by M in the phase direction. Here, the reason for using the filter coefficient $C_{M \times I-n}$ instead of $C_n$ is because the filter performs a convolution operation. When using the filter coefficient $C_n$, the filter serves as a correlator. Therefore, the fourth embodiment realizes 1/M-fold decimator/mixer by subdividing its frequency step (frequency resolution) by I, without performing I-fold interpolation as described in the digital down-converter according to the first embodiment.

Embodiment 5

FIG. 11 illustrates a circuit structure of a digital up-converter (DUC) according to a fifth embodiment of the present invention. A frequency converter with an improved frequency resolution according to the fifth embodiment will be described with reference to FIG. 11.

As mentioned above, the second embodiment realizes free frequency conversion and sampling frequency conversion of M=M1×M2 by the M1-fold interpolator 5 and the M2-fold polyphase structure interpolator/mixer 6, thus relieving the filter characteristic required for the polyphase filter included in the interpolator/mixer 6. However, the frequency step (frequency resolution) undesirably becomes 1/M1. Therefore, the fifth embodiment uses a polyphase filter, a frequency step (frequency resolution) of which is improved M1 times, for the interpolator/mixer 6, thereby improving M1 times the frequency step (frequency resolution) of the digital up-converter (DUC) of FIG. 8 according to the second embodiment.

Referring to FIG. 11, a digital up-converter (DUC) 73 according to the fifth embodiment of the present invention includes an interpolator 5 and an interpolator/mixer 74. The interpolator 5 is comprised of M1-fold up-samplers 21 and lowpass filters 22, and performs MI-fold interpolation on received complex signals i(j) and q(j). The interpolator/mixer 74 performs frequency conversion by a frequency Kω, M2-fold interpolation, and also performs quadrature conversion from the received complex signals to a real signal, on the outputs of the interpolator 5, thereby outputting an RF/IF signal S(i). The interpolator/mixer 74 is comprised of hold circuits 23 for holding the received signals for a time M2, multipliers 24, delays 25, multipliers 26 and adders 27, constituting a 2-step FIR filter which performs sum-of-product operation by multiplying the input signals by signals $\cos(nK\omega)C_{(M1\times M2-n)0}$ and $-\sin(nK\omega)C_{(M1\times M2-n)0}$, and signals $\cos(nK\omega)C_{(M1\times M2-n)1}$ and $-\sin(nK\omega)C_{(M1\times M2-n)1}$, where n=0, 1, . . . (M2-1).

The hold circuits 23 are multi-output circuits for outputting (up-sampling) the same sample M2 in a sampling period of the input signal. The hold circuits 23 simultaneously perform band rejection on held signals by filter coefficients $C_{(M1\times M2-n)0}$ and $C_{(M1\times M2-n)1}$ and frequency conversion of fs1/M2×K by multiplying an input sampling frequency fs1 by signals $\cos(nK\omega)$ and $-\sin(nK\omega)$, and also perform M2-fold interpolation on the input signal of sampling frequency fs1 with a sampling frequency fs2 by outputting signals once every 1/M2 times. The filter coefficients $C_{(M1\times M2-n)}$ are coefficients for M1×M2 polyphase filters determined by repeating M2 polyphase filters having 2 codes as coefficients determined by dividing 2×M2 coefficients by M2, M1 times in the phase direction, where M and M2 are both a positive integer. In this manner, it is possible to realize a structure of switching, every M times, I kinds of coefficient banks of a polyphase filter determined by repeating I times one coefficient determined by dividing M coefficients by M in the phase direction. Here, the reason for using the filter coefficient $C_{(M1\times M2-n)}$ instead of $C_n$ is because the filter performs convolution operation. When using the filter coefficient $C_n$, the filter serves as a correlator.

Further, an adder 28 adds a real signal obtained by multiplying a real signal of the received complex signals by the cos signal to a new real signal created by multiplying an imaginary signal of the received complex signals by the −sin signal, thereby performing quadrature conversion (quadrature modulation) by converting the complex signals to a real signal. Therefore, the fifth embodiment realizes free frequency conversion and sampling frequency conversion by the M1-fold interpolator and the M2-fold interpolator/mixer, without reducing the frequency step (frequency resolution) 1/M1 times as described in the digital up-converter according to the second embodiment.

As described above, the present invention provides a frequency converter having an excellent frequency characteristic and low power consumption, by sharing a multiplier (mixer) used for frequency conversion and a multiplier used for multiplication of FIR filter coefficients, and also using a ploy-phase structure filter. In addition, by arranging a sampling frequency converter in a stage preceding or following the frequency converter, it is possible to change the number of divided polyphase filters according to a conversion ratio of the sampling frequency. As a result, it is possible to freely change a frequency step of the frequency converter. Further, by using a polyphase structure filter determined by repeating the polyphase filters P times in the phase direction, the frequency converter matches the number of divided polyphase filters to the conversion ratio of the sampling frequency, without providing a sampling frequency converter before and after the frequency converter, thereby making it possible to freely change its frequency step without an increase in operations and power consumption. Accordingly, the frequency converter capable of freely performing sampling frequency conversion at multiple rates and freely setting a frequency step can be constructed with a polyphase structure filter having a decreased number of multipliers.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A frequency converter for converting a frequency of an input signal to an arbitrary frequency, comprising:
   M polyphase filters for multiplying each of N coefficients by M signals determined by sampling signals for a period K of a sine wave having a period M/K for one sampling period, on a one-to-one basis, each of the M polyphase filters having N=L/M coefficients (where L and M are both positive integers) determined by dividing L coefficients by M; and
   a sampling frequency converter with a conversion ratio M, the sampling frequency converter being coupled to the M polyphase filters.

2. A frequency converter for converting a frequency of an input signal to an arbitrary frequency, comprising:
   M1 polyphase filters with a conversion ratio M1, for multiplying each of N coefficients by M1 signals determined by sampling signals for a period K of a sine wave having a period M1/K for one sampling period, on a one-to-one basis, each of the M1 polyphase filters having N=L/M coefficients (where L and M are both positive integers) determined by dividing L coefficients by M;
   a sampling frequency converter with a conversion ratio M1, the sampling frequency converter being coupled to the M1 polyphase filters;
   M2 polyphase filters with a conversion ratio M2, for multiplying each of the N coefficients by M2 signals determined by sampling signals for a period K of a sine wave having a period M2/K for one sampling period, on a one-to-one basis, the M2 polyphase filters having M2=M−M1; and
   a sampling frequency converter with a conversion ratio M2, the sampling frequency converter being coupled to the M2 polyphase filters.

3. A frequency converter for converting a frequency of an input signal to an arbitrary frequency, comprising:
   (M×I) polyphase structure filters for multiplying each of P coefficients by (M×I) signals determined by sampling signals for a period K of a sine wave having a period (M×I)/K for one sampling period, on a one-to-one basis (where I is a positive integer), the (M×I) polyphase filters each having P=L/(M×I) coefficients determined by dividing L coefficients by (M×I);
   an I-fold interpolator arranged in a stage following the (M×I) polyphase filters; and
   a sampling frequency converter for performing 1/(M×I)-fold interpolation, the sampling frequency converter being coupled to the (M×I) polyphase filters.

4. A frequency converter for converting a frequency of an input signal to an arbitrary frequency, comprising:
   M×D polyphase filters for multiplying each of coefficients determined by dividing L coefficients by (M×D), by (M×D) signals determined by sampling signals for a period K of a sine wave having a period (M×D)/K for one sampling period, on a one-to-one basis (where D is a positive integer), the (M×D) polyphase filters each having Q=L/(M×D) coefficients determined by dividing the L coefficients by (M×D);

a 1/D-fold decimator arranged in a stage preceding the (M×D) polyphase filters; and a sampling frequency converter for performing (M×D)-fold interpolation, the sampling frequency converter being coupled to the (M×D) polyphase filters.

5. A frequency converter for converting a frequency of an input signal to an arbitrary frequency, comprising:

M polyphase filters for multiplying a code by M signals determined by sampling signals for a period K of a sine wave having a period M/K for one sampling period, on a one-to-one basis, each of the M polyphase filters having as one coefficient the code calculated by dividing M codes (where M is a positive integer and M codes refers to M coefficient codes) by M; and a sampling frequency converter with a conversion ratio M, the sampling frequency converter being coupled to the M polyphase filters;

wherein the input signal is correlated with the code.

6. A frequency converter for converting a frequency of an input signal to an arbitrary frequency, the frequency converter including M polyphase filters with N=L/M coefficients determined by dividing L coefficients by M (where L and M are both positive integers), the frequency converter, comprising:

the M polyphase filters each including;

coefficient banks having P kinds (where P is a positive integer larger than 2) of filter coefficient sequences;

wherein the M polyphase filters consecutively select filter coefficient sequences one-by-one among the P kinds of coefficient banks and setting the selected filter coefficient sequences as multipliers of the M polyphase filters;

wherein an $M^{th}$ polyphase filter among the M polyphase filters provides P kinds of coefficient sequences among P kinds of a total of M phase coefficients calculated by multiplying coefficients determined by repeating M original phase coefficient sequences of the polyphase filter P times in a phase direction by P×M signals determined by sampling signals for a period K of a sine wave having a period P×M/K for one sampling period, on a one-to-one basis.

* * * * *